April 26, 1966 E. SEIF 3,248,558

DISTRIBUTING AND ENCODING DEVICES INCLUDING SEQUENTIALLY NONCONDUCTING TRANSISTOR CHAINS EMPLOYING INPUT TIME CONSTANT CIRCUITS TO EFFECT DIGITAL DELAY

Filed May 1, 1959 2 Sheets-Sheet 1

INVENTOR.
ERIC SEIF
BY Thomas A. Herbert
AGENT

INVENTOR.
ERIC SEIF
BY Thomas O. Herbert
AGENT

United States Patent Office 3,248,558
Patented Apr. 26, 1966

3,248,558

DISTRIBUTING AND ENCODING DEVICES INCLUDING SEQUENTIALLY NONCONDUCTING TRANSISTOR CHAINS EMPLOYING INPUT TIME CONSTANT CIRCUITS TO EFFECT DIGITAL DELAY

Eric Seif, Philadelphia, Pa., assignor to Burroughs Corporation, Detroit, Mich., a corporation of Michigan Filed May 1, 1959, Ser. No. 810,354
29 Claims. (Cl. 307—88.5)

This invention relates to electronic trigger circuits and in particular to a plurality of trigger circuits interconnected to form a digital delay line suitable for use as a distributor or an encoder system.

In electronic circuitry and systems, especially in computer systems, there often arises the problem of translating a numeral to a representative number of distinct pulses. For instance, one pulse could represent the numeral 1, two pulses represent the numeral 2, etc. Such systems, often called encoders, are useful in many computer circuits. For instance, to add two numerals it is merely necessary to produce the representative number of pulses for the two numerals and subsequently to record the total number of pulses produced.

In addition, circuit means are desirable in electronic computer uses for producing a pulse or pulse train sequentially to a definite number of output circuits. Such circuits are often known as pulse distributors.

Circuits have been developed in the prior art to produce such representative pulses and to distribute a single pulse to a plurality of outputs. However, these circuits are often limited not only in their efficiency and size but also in their reliability. Since the pulses to be produced should be distinct, there must be provision for assuring that one pulse be completed before the subsequent pulse begins. Conventional or specially designed drivers and clock circuits have been used in the prior art to fulfill these requirements, but at the expense of greater cost and size.

It is, therefore, an object of this invention to provide an improved pulse generator circuit which is self-timed and which, consequently, requires no external clock system.

It is another object of this invention to improve the operating characteristics of such circuits for use as pulse distributors.

It is still another object of this invention to provide a circuit of the aforementioned character which is suitable for use as an encoder.

It is a further object of this invention to simplify distributor or encoder circuits and to provide more economical construction of them than those of the prior art.

It is another object of this invention to increase the reliability of such circuits.

In achieving the foregoing objects of the invention, a series of transistor circuits is utilized, the number of circuits, or stages, to be determined by the numeral to be represented, or, in the case of a distributor, by the number of outputs desired. Each transistor is conducting in stand-by condition. Upon the application of an input signal upon any one of these transistor stages, that stage is turned "off." Upon the turning "off" of the particular stage, a complementary circuit is "primed" so that when the stage reconducts, the "primed" circuit applies an input signal to the subsequent stage. Consequently, upon initiation of a signal at any particular stage, an "off" state is propagated down the series of stages until it reaches the final stage. Outputs can be taken at each stage and can be grouped so as to provide an output pulse each time a stage is turned off. Or, alternatively, the outputs can be applied to separate external circuits.

An important feature of the invention resides in the positiveness of the action with which each stage is turned "off." This arises from the priming of the stage by the previous stage during its "off" period as well as resumption of conduction in the previous stage acting as the keying signal.

A more complete description of the invention is described in the following specification and in the drawings of which:

Figure 1:
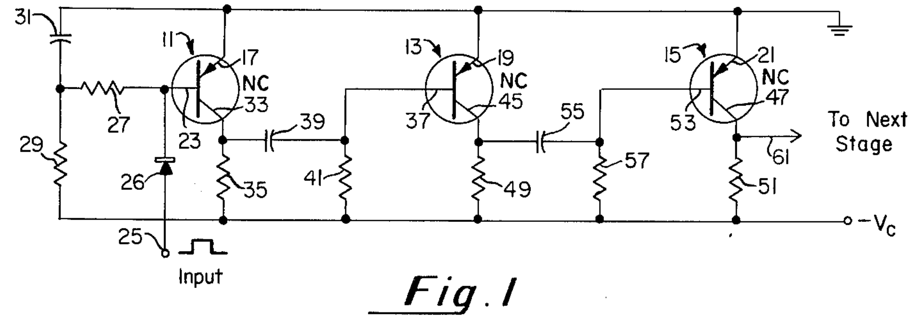
FIG. 1 is a schematic diagram showing a basic circuit of the invention.

Referring now to FIG. 1 of the drawings, three transistors 11, 13 and 15 are arranged in tandem order. The emitters 17, 19 and 21 of each transistor are connected to a source of reference potential, such as ground. The base 23 of the first transistor 11 is connected to a source of input pulses 25 through a diode 26. The base 23 is also connected through resistors 27 and 29 to a source of negative operating potential $-V_c$. From the junction of the resistors 27 and 29 a capacitor 31 is connected to ground. The collector 33 of the first transistor 11 is connected to $-V_c$ through the resistor 35. The collector 33 is coupled to the base 37 of the transistor 13 through the capacitor 39. The collectors 45 and 47 of transistors 13 and 15 are likewise connected to $-V_c$ through resistors 49 and 51. Collector 45 is coupled to the base 53 of transistor 15 through the capacitor 55. Additional stages may be connected in like manner to the connecting point 61 at the collector 47 of transistor 15.

In operation, the transistors 11, 13 and 15 are all in their conducting state in the absence of signal input. Upon the application of a positive input pulse from the source 25, transistor 11 is turned off. In addition to turning "off" transistor 11, the input pulse charges capacitor 31 so that upon termination of the pulse, transistor 11 is retained in its "off" state until the capacitor 31 discharges through resistor 29. While the transistor 11 is "off," capacitor 39 is charged through a path comprising the resistor 35 and the base-emitter junction of the transistor 13, to the value of the voltage drop across resistor 41 thereby causing the right-hand side of the capacitor 39 to become positive with respect to the left-hand side. When capacitor 31 becomes sufficiently discharged, transistor 11 conducts. Collector 33 rises sharply to almost ground potential and the right-hand side of capacitor 39 also rises sharply but to a positive potential well above ground. Transistor 13 is thereby turned off, and capacitor 39 discharges through resistor 41 and the conducting transistor 11.

When transistor 13 turns off, capacitor 55 (in a fashion similar to that described with respect to capacitor 39) begins to charge through resistor 49 and the base-emitter junction of transistor 15.

This action is repeated down the line until the last stage is reached. The duration of the "off" time of each stage, except the first, is dependent upon the time constant of its base circuit. The duration of the "off" time of the first stage is dependent upon the width of the input pulse and the time constant of the circuit including resistor 29. Since each stage provides its own power gain, there is no limitation upon the number of stages which may be used for a particular distributor or encoder. In order to assure that the capacitors 39 and 55 are fully charged so as to provide certain cut off of the following stage, it is important that the charging time constant be shorter than the discharge time constant. This condition is fulfilled by the selection of proper component values in the charge and discharge paths of the capacitors.

Figure 2:
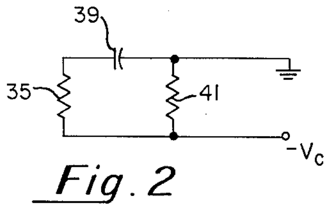
FIG. 2 shows an equivalent of the coupling circuit during charging time.

The circuit shown in FIG. 2 is an equivalent of the transfer circuit in FIG. 1 from transistor 11 to transistor 13 during charging time. The reference numerals used therein are identical to those of the respective components in FIG. 1. Since the base-emitter junction of the transistor 13 is forward biased when the capacitor 39 is charging, the junction of capacitor 39 and resistor 41 is connected substantially to ground. The value of the resistance 35 in the charging path is chosen small in comparison with resistor 41. It will be seen that the charging path is, effectively from $-V_c$ through resistor 35 and capacitor 39 to ground.

Figure 3:
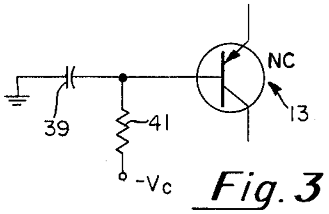
FIG. 3 shows an equivalent of the coupling circuit during discharge time.

FIG. 3 is an equivalent of the same circuit during discharge time. Again identical reference numerals are used. Since, during discharge, the transistor 11 (shown in FIG. 1) is in its conducting state, the left-hand side of capacitor 39 is connected substantially to ground. The transistor 13, being in its "off" condition, is substantially an open circuit. Consequently, the discharge path of capacitor 39 is through the resistor 41 to $-V_c$. As mentioned above, resistor 41 in the discharge path is chosen to be large in comparison with resistor 35 in the charge path. Consequently, the time constant for the discharge circuit will be large in comparison with that for the charging circuit.

Figure 4:
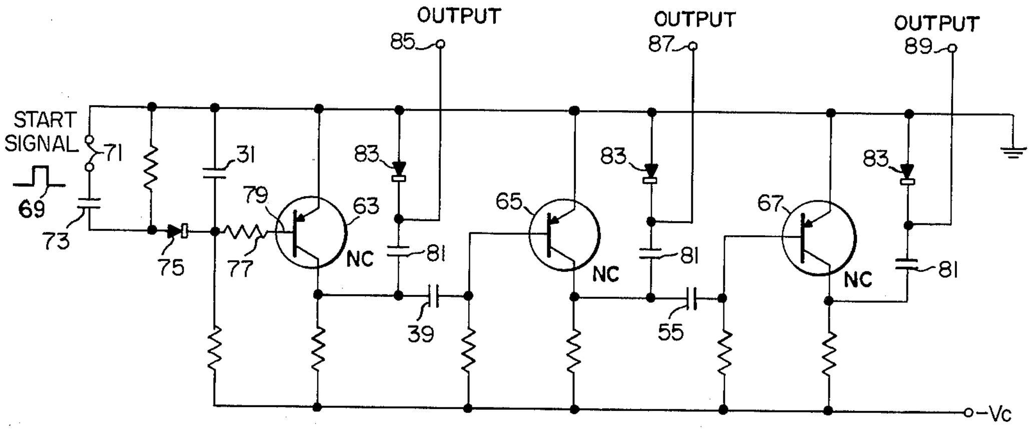
FIG. 4 is a schematic diagram of the circuit used as a distributor.

FIG. 4 shows the circuit of the invention used as a pulse distributor. The series of transistors 63, 65 and 67 are arranged in tandem order in a manner similar to that described in FIG. 1. The tandem may be of any desired length determined only by the number of output pulses desired. A source of a start signal or input pulse 69 is connected to the terminal 71, one of which is returned to ground. The other terminal 71 is connected through a capacitor 73, diode 75 and resistor 77 to the base 79 of transistor 63. Connected between the collector of each transistor and ground is a series circuit comprising a capacitor 81 and a diode 83. At each junction of the capacitor 81 and diodes 83 output terminals 85, 87 and 89 are connected.

In the operation of the circuit of FIG. 4, the transistors 63, 65 and 67 are normally conducting in the absence of an input signal. Upon the initiation of an input pulse, or start signal, at the terminal 71, the base 79 of transistor 63 is driven positive and the transistor 63 is thereby turned off. With the transistor 63 "off," the capacitor 39 charges through base- emitter junction of the "on" transistor 65. Additionally, the capacitor 81 charges through the diode 83. When the input pulse or start signal 69 ceases, and the capacitor 31 has discharged, the transistor 63 again conducts. Its collector rises sharply to almost ground potential, and the right-hand side of capacitor 39 rises sharply to a positive potential well above ground. Transistor 65 cuts off and the capacitors 39 and 81 discharge, thereby creating an output pulse at the terminal 85. The cycle of operation repeats itself at transistor 65 and an output pulse eventually appears at the terminal 87, and subsequently, at terminal 89. In effect, then, upon the initiation of a start signal, output pulses occur, in sequence, at the terminals 85, 87 and 89.

In use, the circuit of FIG. 4 will, therefore, successively present in time relationship output pulses to individual utilization devices connected at the output terminals 85, 87 and 89. In this arrangement, the circuit of FIG. 4 can be employed wherever an electronic distributor is desired to successively apply signals to a plurality of outputs.

It may be noted that it is not necessary that the time constants of all the stages be the same. For uses of the circuit where it is desired to have different pulse spacing between the pulses in a train initiated by a single pulse input, the time constants for discharging the capacitors in each stage are tabulated to produce the proper spacing of each pulse with respect to the previous pulse. It is to be noted, however, that there must be sufficient discharge time so as to provide full charge of the capacitor in the following stage.

Figure 5:
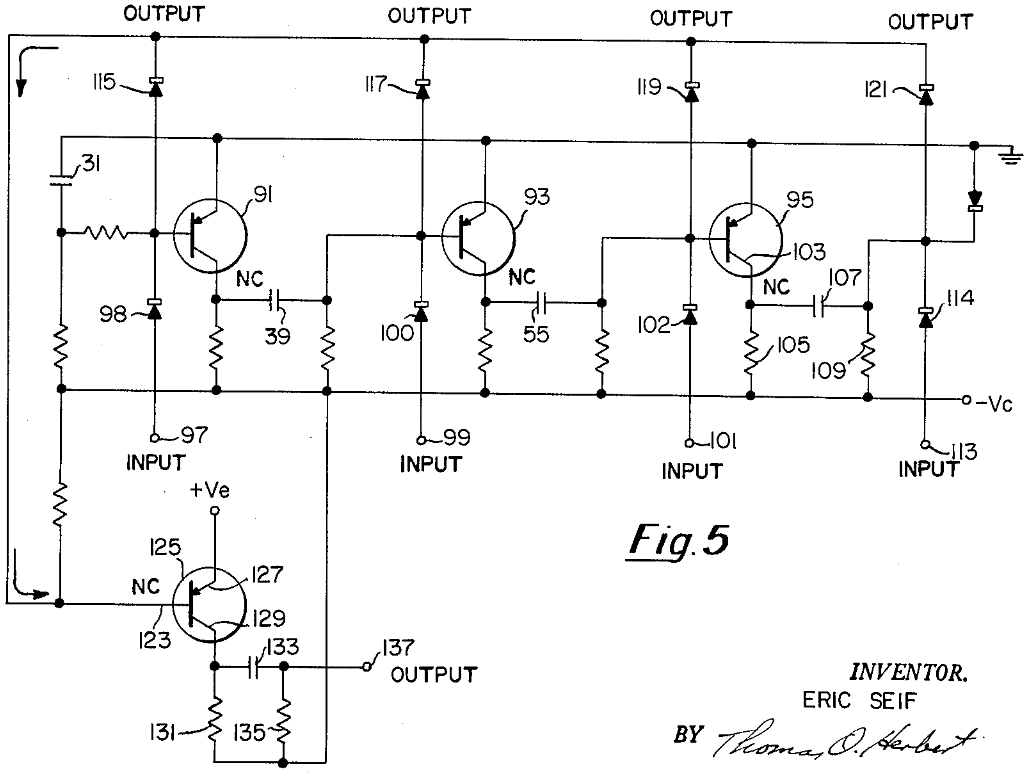
FIG. 5 is a schematic diagram of the circuit used as an encoding system.

The circuit of FIG. 5 shows the invenion used as an encoder. Again, transistors 91, 93 and 95 are arranged in tandem order similar to that shown in FIG. 1. Again the number of stages is determined only by the user's requirements. To the base of each transistor is connected one of the input terminals 97, 99, 101 and 113 through the respective diodes 98, 100, 102 and 114. The collector 103 of transistor 95 is connected to the voltage source $-V_c$ through the resistor 105. The collector 103 is also connected to the voltage source $-V_c$ through the capacitor 107 and the resistor 109. Each of the input terminals is additionally connected through a respective diode 115, 117, 119 and 121 to the base 123 of the transistor 125. The emitter 127 of the transistor 125 is connected to a source of potential $+V_e$. The collector 129 is connected to the source of potential $-V_c$ through the resistor 131. The collector 129 is also connected to the source of potential $-V_c$ through the capacitor 133 and resistor 135. The junction of the capacitor 133 and the resistor 135 is connected to an output terminal 137.

In the operation of the encoder circuit shown in FIG. 5, an input pulse may be applied at any one of the terminals 97, 99, 101, or 113. Upon application of a positive input pulse, for example, at the terminal 99, the pulse is passed through the diodes 100 and 117 to the base 123 of the transistor 125 thereby turning off transistor 125 and causing an output pulse at the terminal 137. The input pulse at the terminal 99 additionally turns off the transistor 93 and the capacitor 55 charges in the manner previously described with respect to FIGS. 1 and 4. Upon expiration of the input pulse at the terminal 99, transistor 93 resumes conduction and the capacitor 55 discharges therethrough. However, prior to its discharge and coincident with the turning on of transistor 93, the right-hand side of capacitor 55 rose sharply to a potential well above ground, in the manner previously described in connection with FIGS. 1 and 4. This sharp rise effects cut off of transistor 95. In addition to cutting off the transistor 95, this positive pulse is passed through the diode 119 to the base 123 of the transistor 125 thereby causing an additional output pulse at the terminal 137. The diode 102 prevents the positive pulse from being fed back into the input. This action propagates to the end of the line causing an output pulse to be applied at the terminal 137 for each stage through which the pulse propagates. Additionally, it should be noted that an output pulse is produced by the initial input pulse. Consequently, if the input pulse is delivered at the terminal 99, there will be three output pulses, one as the result of the initial input pulse, the second as the result of the turning on of transistor 93, and a third which results from the turning on of transistor 95. It will be seen that one less transistor stage than the desired number of outputs is required due to the fact that the input pulse itself causes an output pulse. The circuit of FIG. 5 is, therefore, useful wherever a given and predetermined number of output pulses is required for each single input. An example of such a use would be wherever multiplication is to be carried out by simple pulse-count addition.

The designation NC is printed adjacent each of the transistors in the figures as an abbreviation for "normally conductive" to facilitate appreciation of the description of operation of the circuits of the embodiments of the invention illustrated in the drawings. The output terminals in FIG. 4 and the input terminals and outputs in FIG. 5 are so labeled on the drawings in accordance with the description hereinabove. The arrows drawn from the outputs of the diodes 115, 117, 119, 121, in FIG. 5, illustrate the feeding of the outputs into the base of transistor 125. As indicated by the designation OUTPUT at terminal 137, the encoder output of the FIG. 5 illustrative embodiment is taken at this point.

Figure 6:
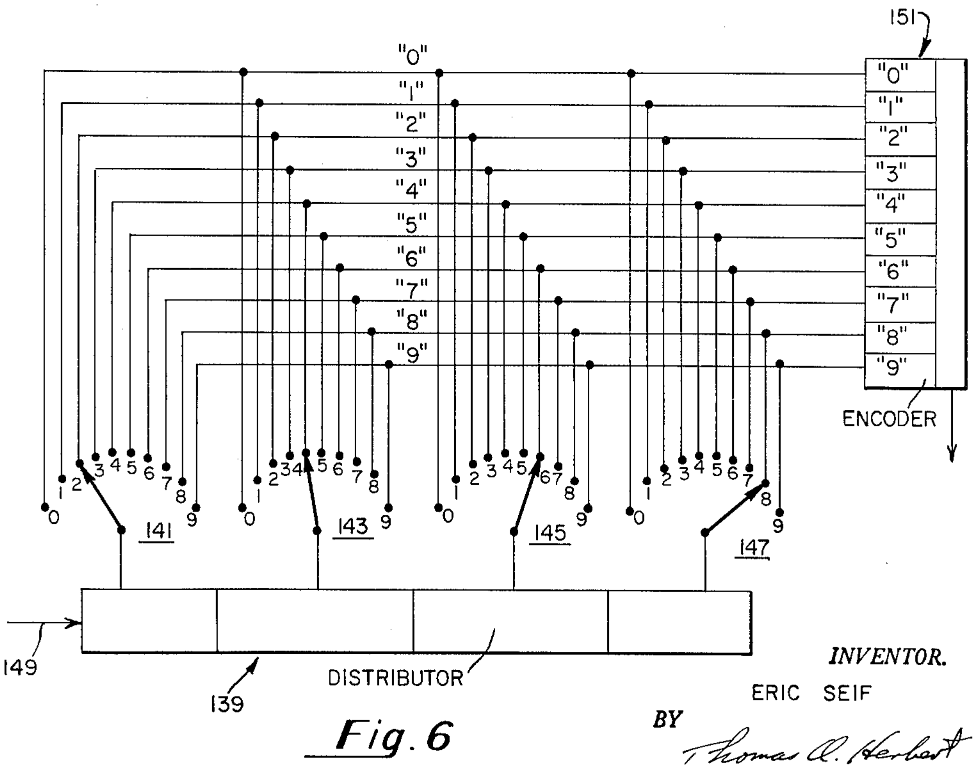
FIG. 6 is a block diagram of the circuit as used in one application of the invention.

FIG. 6 shows, in block diagram form, one practical application of the circuit of the invention. A distributor 139, similar to that shown in FIG. 4 but having four rather than three stages, has each of its output terminals connected to the common terminal of a different ten-position switch 141, 143, 145 and 147. A source of start signals 149 is connected to the first stage of the distributor 139. Each of the ten terminals of the ten-position switches 141, 143, 145 and 147 is connected to a bus line. Respective terminals of each switch are connected to the same bus line. Each bus line, in turn, is connected to a different stage of an encoder 151. The encoder 151 is similar to that shown in FIG. 5 but has ten rather than four inputs.

In operation, the ten-position switches are set to the positions representing the numerals required to be coded. The code number shown in the example is 2468. After the switch positions have been selected, a start signal 149 is applied at the first stage. Upon the initiation of the distributor cycle by the start signal 149, an output pulse is delivered to the common terminal of the switch 141. The movable terminal of the switch 141, being set in the "2" position, causes the output signal to be applied to the "2" bus, and consequently to the "2" input stage of the encoder. The encoder will consequently provide two pulses at its output. The time relationships of the distributor 139 and the encoder 151 are arranged such that the encoder, in this example, may complete an entire cycle of 10 digits while the distributor produces a single output pulse. In construction of the device, this is done by merely designing the time constants of the distributor coupling circuits at least ten times longer than those in the encoder. Subsequent to the cycling of the encoder, the distributor will cause a second output pulse to be applied. This pulse will be applied to the common terminal of the switch 143. The movable terminal of switch 143 being set on the "4" contact, the output pulse will be applied to the "4" bus, and finally to the "4" stage of the encoder. Consequently, the encoder will produce four output pulses. The operation is repeated for the third and fourth stages of the distributor which cause the encoder to produce six and eight output pulses, respectively. The final effect, then, is that the output of the encoder will produce a series of pulses corresponding in number to the sum of the individual numerals set by the ten-position switches for each input pulse applied at input 149.

If the numerals set on the ten-position switches are preselected to give an overall sum of a particular value, the circuit shown in FIG. 6 in conjunction with a counter circuit, many of which are well known in the art, can be used as a verification circuit to determine whether the proper numbers have been set into the switches themselves.

The arrangement of FIG. 6 can be used for multiplication by setting the multiplier into the switches 141, 143, 145 and 147, and applying the multiplicand as digital pulse groups at the input 149. The total pulse output of the encoder 151 may then be added in a counter circuit to obtain the product of the two factors. (The digital pulse groups representing the multiplicand may, if desired, be obtained from a circuit similar to that shown in FIG. 6, specifically from the encoder 151 thereof.)

The embodiments in the diagrams shown and described above are merely examples of the circuit of the invention. It is to be understood that the invention is not limited to these specific embodiments but will include other obvious known equivalents. For instance, although the transistors shown are of the PNP type, it is obvious that NPN transistors could be used by merely reversing voltage polarities. Additionally, base bias circuits could be added for protection of the transistors without altering the invention. The number of stages can be either increased or decreased and since each stage provides its own power gain, there is no limit to the number of stages which can be added. In addition, although transistor circuits are shown, it is obvious that similar circuits could be arranged with vacuum tubes or other circuit elements, with only slight design variations, and still be within the scope of the invention.

I claim:

1. A pulse generator circuit for producing from a single input pulse a series of time-spaced output pulses one at each of a plurality of different output terminals, said pulse generator circuit comprising: a series of transistor stages including a first and at least one following stage coupled in tandem, each stage including a transistor having base, emitter and collector electrodes; means, including a collector resistor for each stage, connecting a source of operating potential between the collector and emitter electrodes of each transistor; means, including a coupling capacitor for each stage except the last, coupling the collector of each transistor to the base of the next adjacent transistor; means, including a base resistor for each stage, connecting said source of operating potential between the base and emitter of each transistor, said coupling capacitor and said collector resistor of each stage except the last comprising a charge path and said base resistor and said coupling capacitor of each said stage following the first stage comprising a discharge path of component value such that the charging path time constant is shorter than the discharging path time constant, said source of operating potential being of a polarity to forward bias the base-emitter junction of each said transistor, whereby each transistor is normally conducting; means for applying an input pulse to the base of the first transistor of the tandem series, said input pulse being of a polarity to reverse bias and turn off said first transistor, said first transistor turning on again following termination of the input pulse, the transistor of the second stage turning off in response to a pulse produced by the turning on of the first-stage transistor, said second-stage transistor turning on again following termination of said produced pulse and discharge of said first-stage coupling capacitor; and output means for taking off the pulse developed at each stage in response to the turning on of the transistor of such stage.

2. A pulse circuit comprising a plurality of transistor stages, each stage including a transistor having a base, emitter and collector; a capacitor between the collector of one transistor and the base of the next transistor; a charging path for said capacitor including the base-emitter junction of said next transistor and a resistor connecting the collector of said one transistor to a source of operating potential; a discharging path for said capacitor including a resistor connecting the base of said next transistor to said source of operating potential; said collector resistors in said charging paths and said base resistors in said discarging paths being of relative value such that the charging path time constant is shorter than the discharging path time constant; means for applying an input pulse to the base of the transistor of the first stage to turn off said first-stage transistor; and means for taking an output pulse from each stage.

3. A pulse circuit comprising a plurality of stages in tandem, each stage having a normally conducting controllable conduction device including at least three electrodes, two of said electrodes being current carrying electrodes and the third being a control electrode, a source of operating potential, said current carrying electrodes of said controllable conduction device being connected in circuit to form a current path across said source of operating potential, a capacitor individual to each conduction device except the last connected between one of said electrodes in said current path and the control electrode of the next succeeding tandem stage whereby each of said stages is successively rendered non-conducting, a relatively low resistance in said current path between said source of operating potential and said capacitor, and a relatively high resistance between the connection of said capacitor to said control electrode and said source of operating potential such that said coupling capacitor and low resistance comprise a charging path and said high resistance and coupling capacitor comprise a discharging path, said charging path being of shorter time constant than said discharging path.

4. The combination in accordance with claim 3 wherein an independent output circuit is coupled to each of said stages.

5. The combination in accordance with claim 4 wherein said output circuit comprises a series diode and capacitor.

6. The combination in accordance with claim 3 wherein a common output stage is coupled to all stages of the pulse circuit.

7. The combination in accordance with claim 6 wherein independent signal input means is coupled to each of said stages.

8. A pulse circuit comprising a plurality of normally conducting transistor stages, coupled in tandem each stage having a transistor, a source of operating potential, an impedance path from the emitter to the base of each said transistor including a portion of the previous stage transistor and a capacitor, a charging path for said capacitor including the base emitter junction of each said transistor and a discharging path for said capacitor including a resistor in series with said capacitor and said source of operating voltage whereby each of said stages is successively rendered nonconducting, the capacitor of each stage after the first being coupled to the collector of the previous stage, said charging path being of lesser resistance capacitance time constant than the resistance capacitance time constant of said discharging path.

9. A pulse delay line comprising a plurality of normally conducting transistors, the emitters of said transistors being grounded, a first plurality of resistors, the collectors of each of said transistors being connected to one end of one of said first plurality of resistors, voltage source terminal means, opposite ends of said first plurality of resistors being connected to said terminal means, a second plurality of resistors, the base of each of said transistors being connected to one end of one of said second plurality of resistors and the other end of said second plurality of resistors being connected to said terminal means, a plurality of coupling capacitors, the base of each of said transistors after the first being coupled to the collector of the preceding transistor through one of said coupling capacitors whereby each of said stages is successively rendered nonconducting, a signal input means coupled to the base of said first transistor.

10. The combination in accordance with claim 9 wherein an independent output circuit is coupled to each of said transistors.

11. The combination in accordance with claim 10 wherein said output circuit comprises a series diode and capacitor coupled between the collector of said transistor and ground.

12. The combination in accordance with claim 9 wherein a common output stage is coupled to all transistors of the delay line.

13. The combination in accordance with claim 12 wherein independent signal input means is coupled to the base of each transistor in the delay line.

14. An electrical device comprising distributor means having an input terminal and a plurality of output terminals, said distributor means further comprising means to produce output pulses having a timed relationship on said output terminals in response to a signal applied to said input terminal, encoder means having a plurality of input terminals and an output terminal, said encoder means including a plurality of normally conducting transistor stages having interconnecting delay coupling means for successively rendering said stages nonconducting and further comprising means to produce output pulses on said output terminal the number of which is determined by which of said plurality of input terminals receives a pulse signal from anyone of said distributor output terminals, a plurality of switching means connected to receive said output pulses of said distributor means and to apply said output pulses to selected ones of said plurality of input terminals of said encoder means.

15. An encoding apparatus for producing a series of electrical signals in timed relationship with each other comprising a plurality of normally conducting single transitor device stages, each transistor being of the type which may be rendered nonconducting in response to the application thereto of a selected polarity electrical signal, a source of electrical reference signals of the selected polarity to which each of said transistors is responsive, first individual output circuit means including first time contstant charging path means for each of said devices in which appears a step output signal the leading edge of which is of the selected polarity to which each of said devices is responsive when the transistor associated therewith is in a state of conduction, individual input circuit means including second time constant discharging path means having a given discharge time constant sensitive to the leading edge of a pulse signal applied to each of said transistors for charging said second time constant means to a potential more than sufficient to render said transistor individual thereto nonconducting, said second time constant means maintaining said device individual thereto nonconducting for a selected time interval determined by said given discharge time constant thereof, said time constant charging means being of value relative to said time constant discharging means such that said charging path is shorter than said discharge path, means connecting mutually exclusive of each other said source of electrical reference signals and the said first output circuit means to individual ones of said input circuit means in such a manner that selected ones of said transistors may be rendered responsive to said source of electrical reference signals while the remainder of said devices are rendered responsive to the said output signal appearing in the said first output circuit means of the device to which it is connected and second individual output circuit means for each of said devices in which pulse signals appear in timed relation with each other.

16. An apparatus for producing a series of electrical signals in timed relationship with each other comprising a plurality of normally conducting single transistor device stages, each transistor being of the type which may be rendered nonconducting in response to the application thereto of a selected polarity electrical signal, each transistor having an emitter, a base and a collector, each transistor stage being connected in common emitter configuration with output taken from its collector and input being applied to its base, a source of electrical reference signals of the selected polarity to which each of said transistors is responsive, individual output circuit means for each of said devices comprising first time constant means having a given charging time constant in which output circuit means appears a step output signal which is of the selected polarity to which each of said devices is responsive when the device associated therewith is in a state of conduction, individual input circuit means including second time constant means having a given discharge time constant sensitive to the step signal applied to each of said transistor stages to render said transistor individual thereto nonconducting, said time constant means maintaining said transistor individual thereto nonconducting for a selected time interval determined by said given discharge time constant thereof, said time constant means being of values such that said charging time constant is shorter than said discharging time constant, means coupling mutually exclusive of each other said source of electrical reference signals and the said output circuit means to individual ones of said input circuit means in such a manner that selected ones of said transistors may be rendered responsive to said source of electrical reference signals while the remainder of said devices are rendered responsive to the said output signal appearing in said output circuit means of the device to which it is connected.

17. An apparatus for producing a series of electrical signals in timed relationship with each other comprising a plurality of normally conducting single active element devices of the type which may be rendered nonconducting in response to the application thereto of a selected polarity electrical signal, each said single active element being a single transistor having an emitter, a base, and a collector and being in common grounded emitter configuration, a source of electrical reference signals of the selected polarity to which each of said devices is responsive, individual output circuit means comprising a first and others for each including first time constant means of said devices in which appears a step output signal the leading edge of which is of the selected polarity to which each of said devices is responsive when the device associated therewith is in a state of conduction, individual input circuit means including second time constant means having a given discharge time constant sensitive to the leading edge of a pulse signal applied to each of said devices for rendering said device individual thereto nonconducting, said second time constant means maintaining said device individual thereto nonconducting for a selected time interval determined by said given discharge time constant thereof, said first time constant means being of shorter time constant than that of said second time constant input means to all said devices after said first device, means connecting mutually exclusive of each other said source of electrical reference signals and the said first output circuit means to individual ones of said input circuit means in such a manner that a selected one of said devices may be rendered responsive to said source of electrical reference signals while the remainder of said devices are rendered responsive to the said output signal appearing in the said output circuit means of the device to which it is connected.

18. An apparatus for producing a series of electrical signals in timed relationship with each other comprising a plurality of normally conducting single transistor stages, each transistor being of the type which may be rendered nonconducting in response to the application thereto of a selected polarity electrical signal, a source of electrical reference signals of the selected polarity to which each of said transistors is responsive, first individual output circuit means comprising first time constant means for each of said transistors in which appears a pulse output signal the trailing edge of which initiates a step signal of the selected polarity to which each of said transistors is responsive when the transistor associated therewith is in a state of conduction, individual input circuit means comprising second time constant means having a given discharge time constant sensitive to the leading edge of a pulse signal applied to each of said transistors for charging said second time constant means to a potential more than sufficient to render said transistor individual thereto nonconducting, said second time constant means maintaining said transistor individual thereto nonconducting for a selected time interval determined by said given discharge time constant thereof, means connecting said source of electrical reference signals to the said individual input circuit means of the first of said transistors and means connecting the said first individual output circuit means of each of said transistors to the said individual input circuit means of the next succeeding one of said transistors, said first time constant means being shorter than said second time constant means, and second individual output circuit means for each of said devices in which said pulse signals appear in timed relation with each other.

19. An apparatus for producing a series of electrical signals in timed relationship with each other comprising a plurality of normally conducting single transistor stages, each transistor being of the type which may be rendered nonconducting in response to the application thereto of a selected polarity electrical signal, a source of electrical reference signals of the selected polarity to which each of said transistors is responsive, individual output circuit means for each of said transistors in which appears a step output signal which is of the selected polarity to which each of said transistors is responsive when the device is in a state of conduction, individual input circuit means including first time constant means having a given discharge time constant sensitive to respectively said source in the case of a first transistor to which the source signal is applied and said step output signals in the case of the succeeding transistors for charging said first time constant means to a potential more than sufficient to render said transistor individual thereto nonconducting, said first time constant means including a capacitor and maintaining said transistor individual thereto nonconducting for a selected time interval determined by said given discharge time constant thereof, said output means further comprising second time constant charging means, said first time constant means of said input circuit means being of time constant sufficient to provide full charge of the capacitor in the succeeding stage, means connecting said source of electrical reference signals to the said individual input circuit means of the first of said transistors and means connecting the said individual output circuit means of each of said transistors to the said individual input circuit means of the next succeeding one of said transistors.

20. An apparatus for producing a series of electrical signals in timed relationship with each other comprising a plurality of stages connected in tandem, each stage comprising a single normally conducting transistor device of the type which may be rendered nonconducting in response to the application thereto of a selected polarity electrical signal, each transistor having a collector, a base, and an emitter, each transistor being connected in common emitter configuration with output being taken from its collector and input being applied to its base, a source of electrical reference signals of the selected polarity to which each of said devices is responsive, first individual output circuit means for each of said devices in which appears a step output signal the leading edge of which is of the selected polarity to which each of said devices is responsive when the device associated therewith is in a state of conduction, said output circuit means comprising first charging path time constant means, individual input circuit means for a first and the subsequent devices of said transistor devices, each said input circuit means including time constant means having a given discharge second time constant sensitive to the leading edge of a pulse signal applied to each of said devices for rendering said device individual thereto nonconducting, said second time constant means maintaining said device individual thereto nonconducting for a selected time interval determined by said given discharge time constant thereof, said subsequent device input time constant means comprising a discharging path, said charging path being of shorter time constant than said discharging path, means connecting said source of electrical reference signals to the said individual input circuit means of said first of said devices, means connecting the said first individual output circuit means of each of said first and succeeding devices to the said individual input circuit means of the next succeeding one of said devices.

21. An encoding apparatus responsive to source signals for producing a series of electrical signals in timed relationship with each other comprising a plurality of normally conducting single transistor devices of the type which may be rendered non-conducting in response to the application thereto of a selected polarity electrical signal, a source of electrical reference signals of the selected polarity to which each of said devices is responsive, individual output circuit means for each comprising a first and others of said devices in which appears a step output signal which is of the selected polarity to which each of said devices is responsive when the device is in a state of conduction, individual input circuit means comprising first input path means responsive when said source signals are applied thereto directly and second input path means responsive to output of a preceding device, said input circuit means including first time constant means having a given discharge time constant sensitive to said source and said step signals for charging said first time constant means to a potential more than sufficient to render said device individual thereto nonconducting, said first time constant means maintaining said device individual thereto nonconducting for a selected time interval determined by said given discharge time constant thereof, means, connecting said source of electrical reference signals to the said individual input circuit means of one transistor of said devices, means connecting the said first individual output circuit means of each of said devices to the said individual input circuit means of the next succeeding one of said devices said individual output circuit means comprising second time constant means associated with said last-named connecting means and of shorter time constant than said first time constant means.

22. An apparatus for producing a series of electrical signals in timed relationship with each other comprising a plurality of normally conducting single active element devices of the type which may be rendered nonconducting in response to the application thereto of a selected polarity electrical signal, each said single active element being a single transistor having a base, a collector and a common emitter, a source of electrical reference signals of the selected polarity to which each of said devices is responsive, individual collector output circuit means including first time constant means having a given charging time constant for each of said devices in which appears a step output signal which is of the selected polarity to which each of said devices is responsive when the device is in a state of conduction, individual input base circuit means including second time constant means having a given discharge time constant sensitive to respectively, said source signal in the case of the first transistor device to which a reference signal is applied and said step output signals in the case of the other transistor devices successive to the one to which reference signals are applied, for rendering said device individual thereto nonconducting, said second time constant means maintaining said device individual thereto nonconducting for a selected time interval determined by said given discharge time constant thereof, said first charging time constant means having a shorter time constant than said second discharge time constant means, means connecting said source of electrical reference signals to the said individual input circuit means of the first of said devices and means connecting the said individual output circuit means of each of said devices to the said individual input circuit means of the next succeeding one of said devices.

23. An apparatus for producing a series of electrical signals in timed relationship with each other comprising a plurality of normally conducting transistor devices of the type which may be rendered nonconducting in response to the application thereto of a selected polarity electrical signal, a source of electrical reference signals of the selected polarity to which each of said devices is responsive, first individual output circuit means for each of said devices in which appears a pulse output signal the trailing edge of which goes toward the selected polarity to which each of said devices is responsive when the device associated therewith is in a state of conduction, individual input circuit means including time constant means having a given discharge time constant sensitive to the leading edge of a pulse signal applied to each of said devices for charging said time constant means to a potential more than sufficient to render said device individual thereto nonconducting, said time constant means maintaining said device individual thereto nonconducting for a selected time interval determined by said given discharge time constant thereof, means coupling mutually exclusive of each other said source of electrical reference signals to the said individual input circuit means of each of said devices and second individual output circuit means for each of said devices in which said pulse signals appear in timed relation with each other.

24. An apparatus for producing a series of electrical signals in timed relationship with each other comprising a plurality of normally conducting transistor devices of the type which may be rendered nonconducting in response to the application thereto of a selected polarity electrical signal, a source of electrical reference signals of the selected polarity to which each of said devices is responsive, first individual output circuit means for each of said devices in which appears a step output signal the leading edge of which is of the selected polarity to which each of said devices is responsive when the device associated therewith is in a state of conduction, individual input circuit means including time constant means having a given discharge time constant sensitive to the leading edge of a pulse signal applied to each of said devices for charging said time constant means to a potential more than sufficient to render said device individual thereto nonconducting, said time constant means maintaining said device individual thereto nonconducting for a selected time interval determined by said given discharge time constant thereof, means establishing connection at different times mutually exclusive of each other of said source of electrical reference signals to the said individual input circuit means of all of said devices and second individual output circuit means for each of said devices in which pulse signals appear in timed relation with each other.

25. An apparatus for producing a series of electrical signals in timed relationship with each other comprising a plurality of normally conducting transistor devices of the type which may be rendered nonconducting in response to the application thereto of a selected polarity electrical signal, a source of electrical reference signals of the selected polarity to which each of said devices in responsive, first individual output circuit means for each of said devices in which appears a pulse output signal the trailing edge of which goes toward the selected polarity to which each of said devices is responsive when the device associated therewith is in a state of conduction, individual input circuit means including time constant means having a given discharge time constant sensitive to the leading edge of a pulse signal applied to each of said devices for charging said time constant means to a potential more than sufficient to render said device individual thereto nonconducting, said time constant means maintaining said device individual thereto nonconducting for a selected time interval determined by said given discharge time constant thereof, means coupling and decoupling at predetermined times mutually exclusive of each other said source of electrical reference signals to the said individual input circuit means of each of said devices and second individual output circuit means for each of said devices in which said pulse signals appear in timed relation with each other.

26. An apparatus for producing a series of electrical signals in timed relationship with each other comprising a plurality of normally conducting transistor devices of the type which may be rendered nonconducting in response to the application thereto of a selected polarity electrical signal, a source of electrical reference signals of the selected polarity to which each of said devices is responsive, first individual output circuit means for each of said devices in which appears a step output signal the leading edge of which is of the selected polarity to which each of said devices is responsive when the device associated therewith is in a state of conduction, individual input circuit means including time constant means having a given discharge time constant sensitive to the leading edge of a step signal applied to each of said devices for charging said time constant means to a potential more than sufficient to render said device individual thereto nonconducting, said time constant means maintaining said device individual thereto nonconducting for a selected time interval determined by said given discharge time constant thereof and means connecting mutually exclusive of each other said source of electrical reference signals to the said individual input circuit means of each of said devices.

27. An apparatus for producing a series of electrical signals in timed relationship with each other comprising a plurality of normally conducting single transistor stages, each transistor being of the type which may be rendered nonconducting in response to the application thereto of a selected polarity signal, each transistor having a base, a collector and an emitter and being connected in common emitter configuration, a source of electrical reference signals of the selected polarity to which each of said transistors is responsive, each of said transistors having a collector circuit in which appears a step output signal the leading edge of which is of the selected polarity to which each of said devices is responsive when the device associated therewith is in a state of conduction, individual input circuit means in the base circuit of each transistor including time constant means having a given discharge time constant sensitive to the leading edge of a pulse signal applied to each of said devices for charging said time constant means to a potential more than sufficient to render said device individual thereto nonconducting, said time constant means maintaining said device individual thereto nonconducting for a selected time interval determined by said given discharge time constant thereof, means coupling mutually exclusive of each other said source of electrical reference signals to the said individual input circuit means of all of said devices and second individual output circuit means for each of said devices in which pulse signals appear in timed relation with each other.

28. An apparatus for producing a series of electrical signals in timed relationship with each other comprising a plurality of normally conducting transistor devices of the type which may be rendered nonconducting in response to the application thereto of a selected polarity electrical signal, a source of electrical reference signals of the selected polarity to which each of said devices is responsive, first individual output circuit means for each of said devices in which appears a step output signal the leading edge of which is of the selected polarity to which each of said devices is responsive when the device associated therewith is in a state of conduction, individual input circuit means including time constant means having a given discharge time constant sensitive to the leading edge of a pulse signal applied to each of said devices for charging said time constant means to a potential more than sufficient to render said device individual thereto nonconducting, said time constant means maintaining said device individual thereto nonconducting for a selected time interval determined by said given discharge time constant thereof, means connecting mutually exclusive of each other said source of electrical reference signals to the said individual input circuit means of one at a time, all of said devices and second individual output circuit means for each of said devices in which said pulse signals appear in timed relation with each other.

29. In combination, a distributor, switching means and an encoder, said distributor and said encoder each comprising a plurality of normally conducting single transistor stages connected in tandem, each transistor being of the type which may be rendered nonconducting in response to the application thereto of a selected polarity electrical signal, a source of electrical signals of the selected polarity to which each of said transistors is responsive, means coupling said signals from said source into said distributor, individual output circuit means for each of said stages in which when its transistor is turned on after having been made nonconducting appears a step signal of the polarity to which each of said transistors is responsive when conducting, individual time constant means having a given time constant for each stage for maintaining said stage nonconducting for a selected time interval determined by said given discharge time constant, individual input means to each transistor of said encoder, said switching means being settable to couple in predetermined relationship individual selected ones of said distributor stage outputs to individual selected ones of said encoder input means, to thereby provide encoder pulse output in timed relationship, of number of pulses in accordance with the setting of said switching means.

References Cited by the Examiner

UNITED STATES PATENTS

| | | | |
|---|---|---|---|
| 2,639,378 | 5/1953 | Moerman | 328—106 |
| 2,837,663 | 6/1958 | Walz | 307—88.5 |
| 2,876,365 | 3/1959 | Slusser | 307—88.5 |
| 2,886,639 | 5/1959 | Reek | 307—88.5 |
| 2,891,195 | 6/1959 | Smyth | 307—88.5 |
| 2,933,625 | 4/1960 | Townsend | 307—88.5 |

OTHER REFERENCES

Pub. I, "Transistor Circuits," by Shea-Wiley, 1953, p. 260 relied on.

ARTHUR GAUSS, *Primary Examiner.*

GEORGE N. WESTBY, *Examiner.*